United States Patent [19]

Nelson et al.

[11] Patent Number: 5,666,512
[45] Date of Patent: Sep. 9, 1997

[54] DISK ARRAY HAVING HOT SPARE RESOURCES AND METHODS FOR USING HOT SPARE RESOURCES TO STORE USER DATA

[75] Inventors: Marvin D. Nelson, Boise; Theresa A. Burkes, Meridian; Bryan M. Diamond, Boise; Michael B. Jacobson, Boise; Wade A. Dolphin, Boise; Douglas L. Voigt, Boise, all of Id.

[73] Assignee: Hewlett-Packard Company, Palo Alto, Calif.

[21] Appl. No.: 386,574

[22] Filed: Feb. 10, 1995

[51] Int. Cl.$^6$ ............................................. G06F 12/16
[52] U.S. Cl. ........................... 711/114; 395/182.04
[58] Field of Search .................... 395/441, 488, 395/489, 497.04, 182.03, 182.04, 182.05

[56] References Cited

U.S. PATENT DOCUMENTS

| | | | |
|---|---|---|---|
| 5,155,835 | 10/1992 | Belsan | 395/441 |
| 5,195,100 | 3/1993 | Katz et al. | 395/182.2 |
| 5,237,658 | 8/1993 | Walker et al. | 395/858 |
| 5,258,984 | 11/1993 | Menon et al. | 395/182.05 |
| 5,276,867 | 1/1994 | Kenley et al. | 395/600 |
| 5,278,838 | 1/1994 | Ng et al. | 395/182.04 |
| 5,287,462 | 2/1994 | Jibbe et al. | 395/856 |
| 5,289,418 | 2/1994 | Youngerth | 365/201 |
| 5,297,258 | 3/1994 | Hale et al. | 395/441 |
| 5,301,297 | 4/1994 | Menon et al. | 395/441 |
| 5,390,327 | 2/1995 | Lubbers et al. | 395/182.05 |
| 5,392,244 | 2/1995 | Jacobson et al. | 395/441 |
| 5,455,934 | 10/1995 | Holland et al. | 395/404 |
| 5,479,653 | 12/1995 | Jones | 395/182.03 |
| 5,485,571 | 1/1996 | Menon | 395/182.055 |
| 5,491,810 | 2/1996 | Allen | 395/444 |
| 5,519,844 | 5/1996 | Stallmo | 395/441 |
| 5,524,204 | 6/1996 | Verdoorn, Jr. | 395/182.04 |
| 5,542,065 | 7/1996 | Burkes et al. | 395/441 |
| 5,568,629 | 10/1996 | Gentry et al. | 395/441 |
| 5,572,661 | 11/1996 | Jacobson | 395/182.05 |
| 5,574,851 | 11/1996 | Rathunde | 395/182.05 |
| 5,592,648 | 1/1997 | Schultz et al. | 395/441 |
| 5,596,709 | 1/1997 | Bond et al. | 395/182.05 |
| 5,615,352 | 3/1997 | Jacobson et al. | 395/441 |

OTHER PUBLICATIONS

"RAID: High–Performance, Reliable Secondary Storage" by Peter M. Chen, Edward K. Lee, Garth A. Gibson, Randy H. Katz and David A. Patterson; Mar. 1994.

*Primary Examiner*—Tod R. Swann
*Assistant Examiner*—Keith W. Saunders

[57] ABSTRACT

A disk array data storage system has a plurality of storage disks and a disk array controller for coordinating transfer of user data to and from the storage disks. A memory manager is provided to manage memory allocation and data storage on the disk array. The memory manager maintains a sufficient quantity of hot spare storage space that can be made available for reconstructing the user data and restoring redundancy in the event one of the storage disks fails. Until a disk fails, however, the memory manager uses the hot spare space to store user and redundant data while guaranteeing that the storage space can be used for rebuilding following a storage disk failure. In this manner, all storage disks in the array are used to store user data, and additionally to maintain storage space that can be easily made available for purposes of hot spare in the event of disk failure.

20 Claims, 6 Drawing Sheets

DISKS

| 0 | 1 | 2 | 3 | STRIPE NUMBER |
|---|---|---|---|---|
| 0 | 0' | 1 | 1' | 0 |
| 2 | 2' | 3 | 3' | 1 |
| 4 | 4' | 5 | 5' | 2 |
| 6 | 6' | 7 | 7' | 3 |
| * | * | * | * | * |
| * | * | * | * | * |
| * | * | * | * | * |
| T-1 | T-1' | T | T' | S |

*Fig 2*

DISKS

| 0 | 1 | 2 | 3 | STRIPE NUMBER |
|---|---|---|---|---|
| 0 | 1 | 2 | P | 0 |
| 3 | 4 | P | 5 | 1 |
| 6 | P | 7 | 8 | 2 |
| P | 9 | 10 | 11 | 3 |
| * | * | * | * | * |
| * | * | * | * | * |
| * | * | * | * | * |
| P | R-2 | R-1 | R | Q |

*Fig 3*

| | 0 | 1 | 2 | 3 | 4 | 5 |
|---|---|---|---|---|---|---|
| ... | ... | ... | ... | ... | ... | ... |
| 90 { | 1 | 1' | 2 | 2' | 3 | 3' (FAILED) |
| | 4 | 4' | 5 | 5' | 6 | 6' (FAILED) |
| | 7 | 7' | 8 | 8' | 9 | 9' (FAILED) |
| ... | ... | ... | ... | ... | ... | ... |
| 92 { | 1 | 2 | 3 | 4 | P | FAILED |
| | 5 | 6 | 7 | P | 8 | FAILED |
| | 9 | UNUSED | P | UNUSED | UNUSED | FAILED |
| ... | ... | ... | ... | ... | ... | ... |

Fig. 7

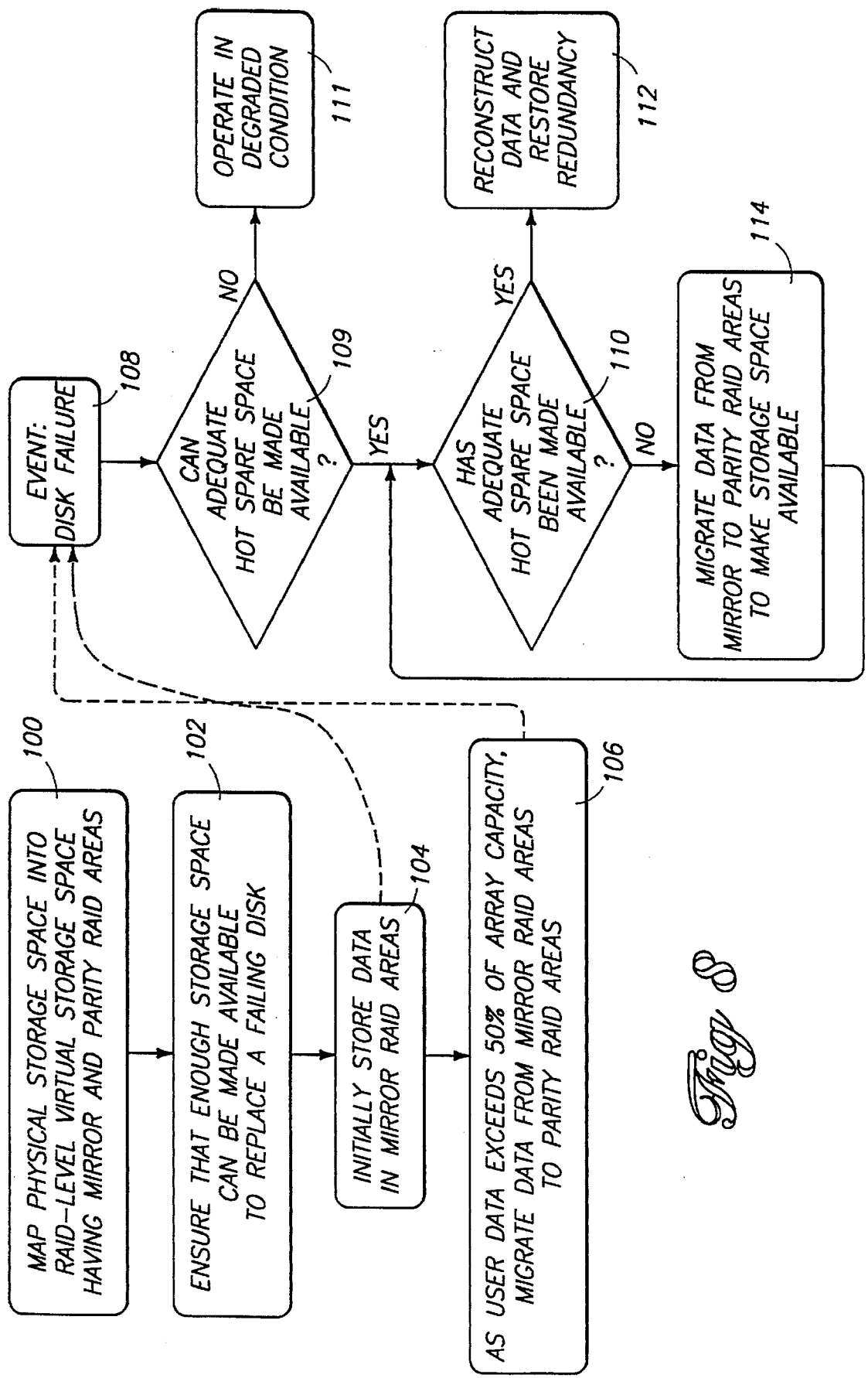

5,666,512

DISK ARRAY HAVING HOT SPARE RESOURCES AND METHODS FOR USING HOT SPARE RESOURCES TO STORE USER DATA

FIELD OF THE INVENTION

This invention relates to disk arrays, and more particularly, redundant hierarchic disk array data storage systems having hot spare resources to provide sufficient space for reconstruction of user data and redundant information in the event that a storage disk fails. This invention also relates to methods for using the hot spare resources to store user data until such resources become needed to facilitate rebuilding.

BACKGROUND OF THE INVENTION

Disk array data storage systems have multiple storage disk drive devices which are arranged and coordinated to form a single mass storage system. There are three primary design criteria for such storage systems: cost, performance, and availability. It is most desirable to produce memory devices that have a low cost per megabyte, a high input/output performance, and high data availability. "Availability" is the ability to access data stored in the storage system and the ability to insure continued operation in the event of some failure. Typically, data availability is provided through the use of redundancy wherein data, or relationships among data, are stored in multiple locations. In the event that a storage disk in the disk array partially or completely fails, the user data can be reconstructed via the redundant data stored on the remaining disks.

There are two common methods of storing redundant data. According to the first or "mirror" method, data is duplicated and stored in two separate areas of the storage system. For example, in a disk array, the identical data is provided on two separate disks in the disk array. The mirror method has the advantages of high performance and high data availability due to the duplex storing technique. However, the mirror method is also relatively expensive as it effectively doubles the cost of storing data.

In the second or "parity" method, a portion of the storage area is used to store redundant data, but the size of the redundant storage area is less than the remaining storage space used to store the original data. For example, in a disk array having five disks, four disks might be used to store data with the fifth disk being dedicated to storing redundant data. The parity method is advantageous because it is less costly than the mirror method, but it also has lower performance and availability characteristics in comparison to the mirror method.

Apart from data redundancy, some disk array data storage systems enhance data availability by reserving an additional physical storage disk that can be substituted for a failed storage disk. This extra storage disk is referred to as a "spare." The spare disk is used to reconstruct user data and restore redundancy in the disk array after the disk failure, a process known as "rebuilding." In some cases, the extra storage disk is actually attached to and fully operable within the disk array, but remains idle until a storage disk fails. These live storage disks are referred to as "hot spares".

While the hot spare disk is useful in the event of disk failure, it provides no services to the disk array during normal operation when all disks are functioning properly. Reserving and earmarking an entire physical storage disk for hot spare purposes therefore increases costs to the system, without the benefit of fully utilizing the additional resources for data storage functions.

It would be advantageous to provide hot spare resources while still fully utilizing all storage disks of the disk array.

SUMMARY OF THE INVENTION

This invention provides a disk array data storage system that fully utilizes all storage disks attached to the array, yet still affords hot spare resources. Instead of reserving and earmarking an entire physical disk for hot spare, the system and methods of this invention reserve the logical capacity of a hot spare disk that consists of available storage space distributed across multiple storage disks in the array. In this manner, all storage disks are used to store user data, while ensuring that an adequate quantity of space can be made available for reconstructing user data and restoring redundancy in the event of a disk failure.

According to one aspect of this invention, a disk array data storage system has a plurality of storage disks and a disk array controller for coordinating transfer of user data to and from the storage disks. A RAID management system is provided to map a RAID-level virtual storage space onto the physical storage space of the storage disks. The RAID-level virtual storage space presents the physical storage space as multiple RAID areas including mirror RAID areas which store data according to mirror redundancy and parity RAID areas which store data according to parity redundancy. The RAID management system also maps the RAID-level virtual storage space into an application-level virtual storage space that is presented to the user.

When the hot spare option is enabled, the RAID management system uses the hot spare space to store user data in mirror storage while also guaranteeing that the hot spare space can be made available for rebuilding redundancy following a storage disk failure. Space is made available by migrating data from mirror storage to parity storage. This migration simultaneously increases the amount of parity storage while decreasing the amount of mirror storage. Concurrently with this migration process, the stripe sizes for data storage are decreased due to the lost space from the failed storage disk.

According to this system, all storage disks in the array are used to store user data, and additionally to maintain storage space that can be easily made available for purposes of hot spare in the event of disk failure. This use of hot spare storage space significantly improves performance by increasing parallelism and by providing more capacity for mirror storage.

DESCRIPTION OF THE DRAWINGS

Preferred embodiments of the invention are described below with reference to the following accompanying drawings depicting examples embodying the best mode for practicing the invention.

FIG. 2 is a diagrammatic illustration of storage space on multiple storage disks and shows data storage according RAID Level 1.

FIG. 3 is a diagrammatic illustration of storage space on multiple storage disks and shows data storage according RAID Level 5.

FIG. 7 is a diagrammatic illustration of storage space on multiple storage disks and shows how data migration from a RAID Level 1 storage to RAID Level 5 storage makes space available for hot spare purposes.

FIG. 8 is a flow diagram of a method for operating a disk array to ensure the availability of hot spare space.

DETAILED DESCRIPTION OF THE INVENTION

This disclosure of the invention is submitted in furtherance of the constitutional purposes of the U.S. Patent Laws "to promote the progress of science and useful arts". U.S. Constitution, Article 1, Section 8.

Figure 1:
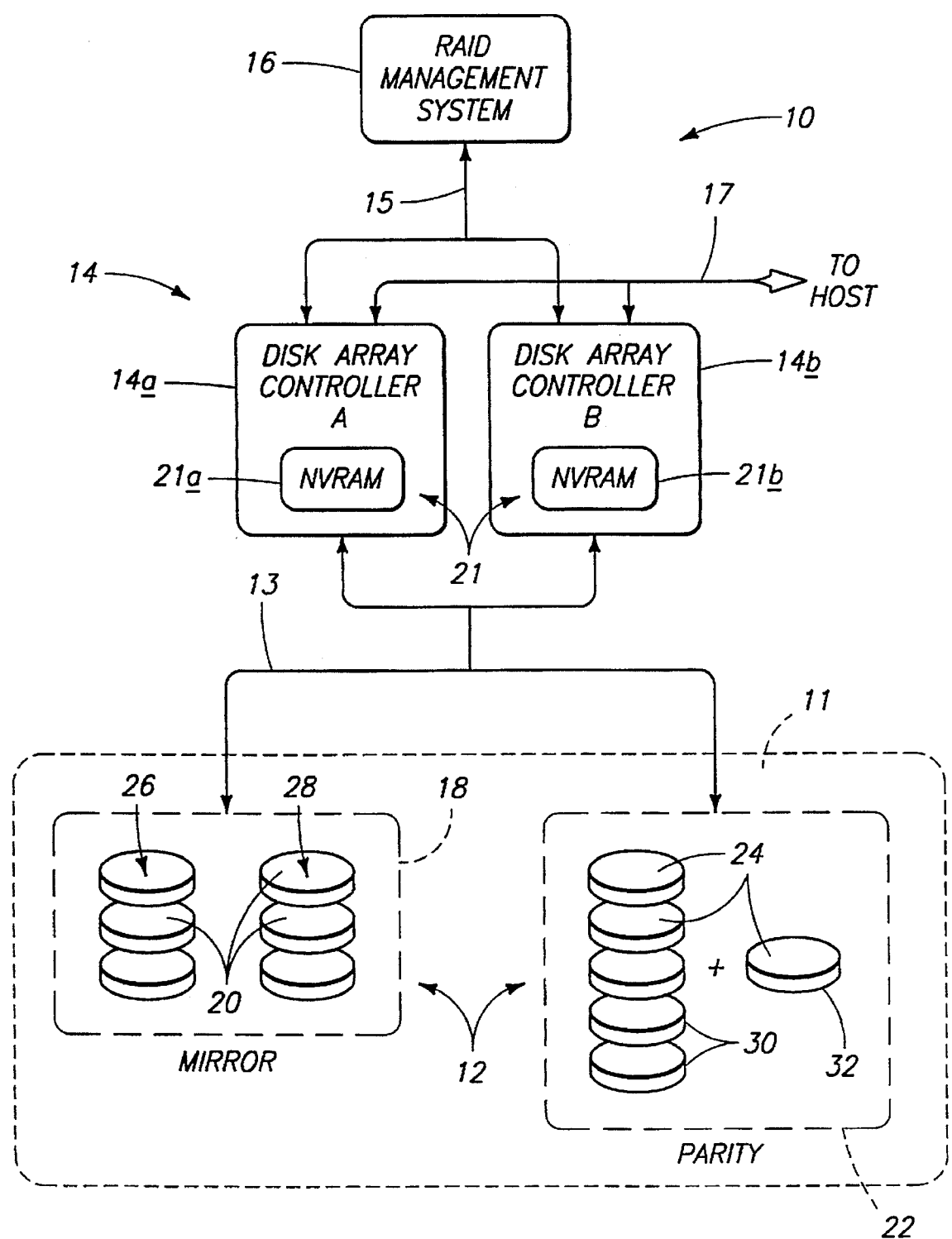
FIG. 1 is a diagrammatic block diagram of a redundant hierarchic disk array data storage system according to this invention.

FIG. 1 shows a data storage system 10 constructed according to this invention. Preferably, data storage system 10 is a disk array data storage system which includes a hierarchic disk array 11 having a plurality of storage disks 12, a disk array controller 14 coupled to the disk array 11 to coordinate transfer of user data to and from the storage disks 12, and a RAID management system 16. This invention is described in the context of its preferred implementation as a redundant hierarchic disk array system. It is noted, however, that aspects and concepts of this invention can be utilized in other types of disk array data storage systems, such as non-hierarchic disk arrays.

For purposes of this disclosure, a "disk" is any non-volatile, randomly accessible, rewritable mass storage device which has the ability of detecting its own storage failures. It includes both rotating magnetic and optical disks and solid-state disks, or non-volatile electronic storage elements (such as PROMs, EPROMs, and EEPROMs). The term "disk array" is a collection of disks, the hardware required to connect them to one or more host computers, and management software used to control the operation of the physical disks and present them as one or more virtual disks to the host operating environment. A "virtual disk" is an abstract entity realized in the disk array by the management software.

The term "RAID" (Redundant Array of Independent Disks) means a disk array in which part of the physical storage capacity is used to store redundant information about user data stored on the remainder of the storage capacity. The redundant information enables regeneration of user data in the event that one of the array's member disks or the access path to it fails. A more detailed discussion of RAID systems is found in a book entitled, *The RAIDBook: A Source Book for RAID Technology*, published Jun. 9, 1993, by the RAID Advisory Board, Lino Lakes, Minn.

Disk array controller 14 is coupled to disk array 11 via one or more interface buses 13, such as a small computer system interface (SCSI). RAID management system 16 is operatively coupled to disk array controller 14 via an interface protocol 15. Data memory system 10 is also coupled to a host computer (not shown) via an I/O interface bus 17. RAID management system 16 can be embodied as a separate component, or configured within disk array controller 14 or within the host computer to provide a data manager means for controlling disk storage and reliability levels, and for transferring data among various reliability storage levels. These reliability storage levels are preferably mirror or parity redundancy levels as described below, but can also include a reliability storage level with no redundancy at all.

The disk array controller 14 is preferably implemented as a dual controller consisting of disk array controller A, referenced by numeral 14a, and disk array controller B, referenced by numeral 14b. Dual controllers 14a and 14b enhance reliability by providing continuous backup and redundancy in the event that one controller becomes inoperable. This invention can be practiced, however, with a single controller or other architectures.

The hierarchic disk array 11 can be characterized as different storage spaces, including its physical storage space and one or more virtual storage spaces. These various views of storage are related through mapping techniques. For example, the physical storage space of the disk array can be mapped into a virtual storage space which delineates storage areas according to the various data reliability levels. Some areas within the virtual storage space can be allocated for a first reliability storage level, such as mirror or RAID level 1, and other areas can be allocated for a second reliability storage level, such as parity or RAID level 5. The various mapping techniques and virtual spaces concerning RAID levels are described below in more detail.

Data storage system 10 includes a memory map store 21 that provides for persistent storage of the virtual mapping information used to map different storage spaces into one another. The memory map store is external to the disk array, and preferably resident in the disk array controller 14. The memory mapping information can be continually or periodically updated by the controller or RAID management system as the various mapping configurations among the different views change.

Preferably, the memory map store 21 is embodied as two non-volatile RAMs (Random Access Memory) 21a and 21b which are located in respective controllers 14a and 14b. An example non-volatile RAM (NVRAM) is a battery-backed RAM. A battery-backed RAM uses energy from an independent battery source to maintain the data in the memory for a period of time in the event of power loss to the data storage system 10. One preferred construction is a self-refreshing, battery-backed DRAM (Dynamic RAM).

The dual NVRAMs 21a and 21b provide for redundant storage of the memory mapping information. The virtual mapping information is duplicated and stored in both NVRAMs 21a and 21b according to mirror redundancy techniques. In this manner, NVRAM 21a can be dedicated to storing the original mapping information and NVRAM 21b can be dedicated to storing the redundant mapping information. In an alternative construction, a mirrored memory map store can be configured using a single non-volatile RAM with sufficient space to store the data in duplicate.

As shown in FIG. 1, disk array 11 has multiple storage disk drive devices 12. Example sizes of these storage disks are one to three Gigabytes. The storage disks can be independently connected or disconnected to mechanical bays that provide interfacing with SCSI bus 13. In one implementation, the data storage system is designed with twelve active mechanical bays. Four SCSI buses are used to interface these bays with disk array controller 14 (i.e., one bus per three mechanical bays). If the active bays are fully loaded, the data storage system has an example combined capacity of 12–36 Gigabytes. Disk array controller 14 recognizes storage disks 12 regardless into which bay they are plugged. The data storage system 10 is designed to permit "hot plug" of additional disks into available mechanical bays in the disk array while the disk array is in operation.

The storage disks 12 in disk array 11 can be conceptualized, for purposes of explanation, as being arranged in a mirror group 18 of multiple disks 20 and a parity group 22 of multiple disks 24. Mirror group 18 represents a first memory location or RAID area of the disk array which stores data according to a first or mirror redundancy level. This mirror redundancy level is also considered a RAID Level 1. RAID Level 1, or disk mirroring, offers the highest data reliability by providing one-to-one protection in that every bit of data is duplicated and stored within the data storage system. The mirror redundancy is diagrammatically represented by the three pairs of disks 20 in FIG. 1. Original data can be stored on a first set of disks 26 while duplicative, redundant data is stored on the paired second set of disks 28.

FIG. 2 illustrates the storage of data according to RAID Level 1 in more detail. The vertical columns represent individual disks, of which disks 0, 1, 2, and 3 are illustrated. The physical storage space contained in this disk array of four disks can be configured into multiple stripes, as represented by the horizontal rows. A "stripe" extends across the storage disks and is comprised of numerous, equal sized segments of storage space where one segment is associated with each disk in the array. That is, a segment is the portion of a stripe that resides on a single disk. Each stripe holds a predetermined amount of data which is distributed across the storage disks. Some segments of a stripe are used for original data while other segments are used for redundant data.

In this example of mirror redundancy (RAID Level 1), data stored on disk 0 in segment 0 of stripe 0 is duplicated and stored on disk 1 in segment 0' of stripe 0. Similarly, data stored on disk 2 in segment 5 of stripe 2 is mirrored into segment 5' of stripe 2 on disk 3. In this manner, each piece of data is duplicated and stored on the disks. The redundancy layout of FIG. 2 is provided for explanation purposes. The redundant data need not be placed neatly in the same stripe as is shown. For example, data stored on disk 0 in segment 2 of stripe 1 could be duplicated and placed on disk 3 in segment T' of stripe S.

With reference again to FIG. 1, the parity group 22 of disks 24 represent a second memory location or RAID area in which data is stored according to a second redundancy level, such as RAID Level 5. In this explanatory illustration of six disks, original data is stored on the five disks 30 and redundant "parity" data is stored on the sixth disk 32.

FIG. 3 shows a parity RAID area layout in more detail. Similar to the mirror RAID area layout of FIG. 2, the physical storage space of disks 0, 1, 2, 3 can be configured into multiple equal sized stripes. In this illustrated example, data is stored according to RAID Level 5 and the redundant data stored in the segments is referenced by letter P. The redundant P segments store the parity of the other segments in the stripe. For example, in stripe 0, the redundant P segment on disk 3 stores the parity of disks 0, 1, and 2. The parity for each stripe is computed by some function, such as an exclusive OR function which is represented by the symbol "⊕". The parities for the first four stripes (with the subscript numeral representing the corresponding stripe) are as follows:

$$P_0 = \text{Segment } 0 \oplus \text{Segment } 1 \oplus \text{Segment } 2$$
$$= \text{Disk } 0 \oplus \text{Disk } 1 \oplus \text{Disk } 2$$
$$P_1 = \text{Segment } 3 \oplus \text{Segment } 4 \oplus \text{Segment } 5$$
$$= \text{Disk } 0 \oplus \text{Disk } 1 \oplus \text{Disk } 3$$
$$P_2 = \text{Segment } 6 \oplus \text{Segment } 7 \oplus \text{Segment } 8$$
$$= \text{Disk } 0 \oplus \text{Disk } 2 \oplus \text{Disk } 3$$
$$P_3 = \text{Segment } 9 \oplus \text{Segment } 10 \oplus \text{Segment } 11$$
$$= \text{Disk } 1 \oplus \text{Disk } 2 \oplus \text{Disk } 3$$

Parity redundancy allows regeneration of data which becomes unavailable on one of the disks. For example, if the data in segment 5 becomes unavailable, its contents can be ascertained from segments 3 and 4 and the parity data in segment P. Parity storage is less expensive than mirror storage, but is also less reliable and has a lower performance.

The disk arrangement of FIG. 1 is provided for conceptual purposes. In practice, the disk array 11 would simply have a plurality of disks 12 which are capable of storing data according to mirror and parity redundancy. Among the available storage space provided by all disks 12, a portion of that storage space would be allocated for mirror redundancy and another portion would be allocated for parity redundancy. Preferably, disks 12 are configured to contain plural, equal sized storage regions (referenced as numeral 35 in FIG. 4), wherein individual regions have multiple segments. The regions are grouped together to form RAID areas in one virtual view of the storage space. Additionally, another (host-defined) view of storage space is presented to the user or host so that the RAID areas and data redundancy storing techniques are transparent to the user or host. These features are discussed below in more detail with reference to FIG. 4.

Data storage system 10 manages the "migration" of data between mirror and parity storage schemes. The management of both types of redundancy is coordinated by RAID management system 16 (FIG. 1). RAID management system 16 manages the two different types of RAID areas in the disk array as a memory hierarchy with the mirror RAID areas acting similar to a cache for the parity RAID areas. RAID management system 16 shifts, organizes, and otherwise manages the data between the mirror and parity RAID areas in accordance with a defined performance protocol. The process of moving data between the mirror and parity RAID areas is referred to as "migration".

Data storage system 10 tries to place the more performance-critical data in the mirror RAID areas since this affords the highest performance and reliability. The performance protocols implemented by RAID management system 16 includes one of two preferred migration policies. According to the first migration policy, known as "access frequency", the most frequently accessed data on the hierarchic disk array is maintained in the mirror RAID area 18. Less frequently accessed data is maintained in the parity RAID area 22. According to a second migration policy, known as "access recency", the most recently accessed data is maintained in the mirror RAID area 18 while the less recently accessed data is stored in parity RAID area 22. Other performance protocols may be employed. Ideally, such protocols are defined based upon the specific computer application and the needs of the user.

Additionally, the RAID management system 16 automatically "tunes" the storage resources of a data storage system according to a function of two parameters: size of the physical storage capacity and size of the present amount of user data being stored in the data storage system. Initially, all data is stored in mirror RAID areas because this affords the highest performance and reliability. As more data is added to the data storage system, the data is migrated between mirror RAID areas and parity RAID areas to optimize performance and reliability. As the data storage system approaches full capacity, more and more data is migrated to parity RAID areas in an effort to meet all demands by the user while still providing reliability through redundancy. Accordingly, the data storage system of this invention affords maximum flexibility and adaptation. It does not require the user to select a specific storage regime, but instead can adapt to any demand placed on it by the user.

Figure 4:
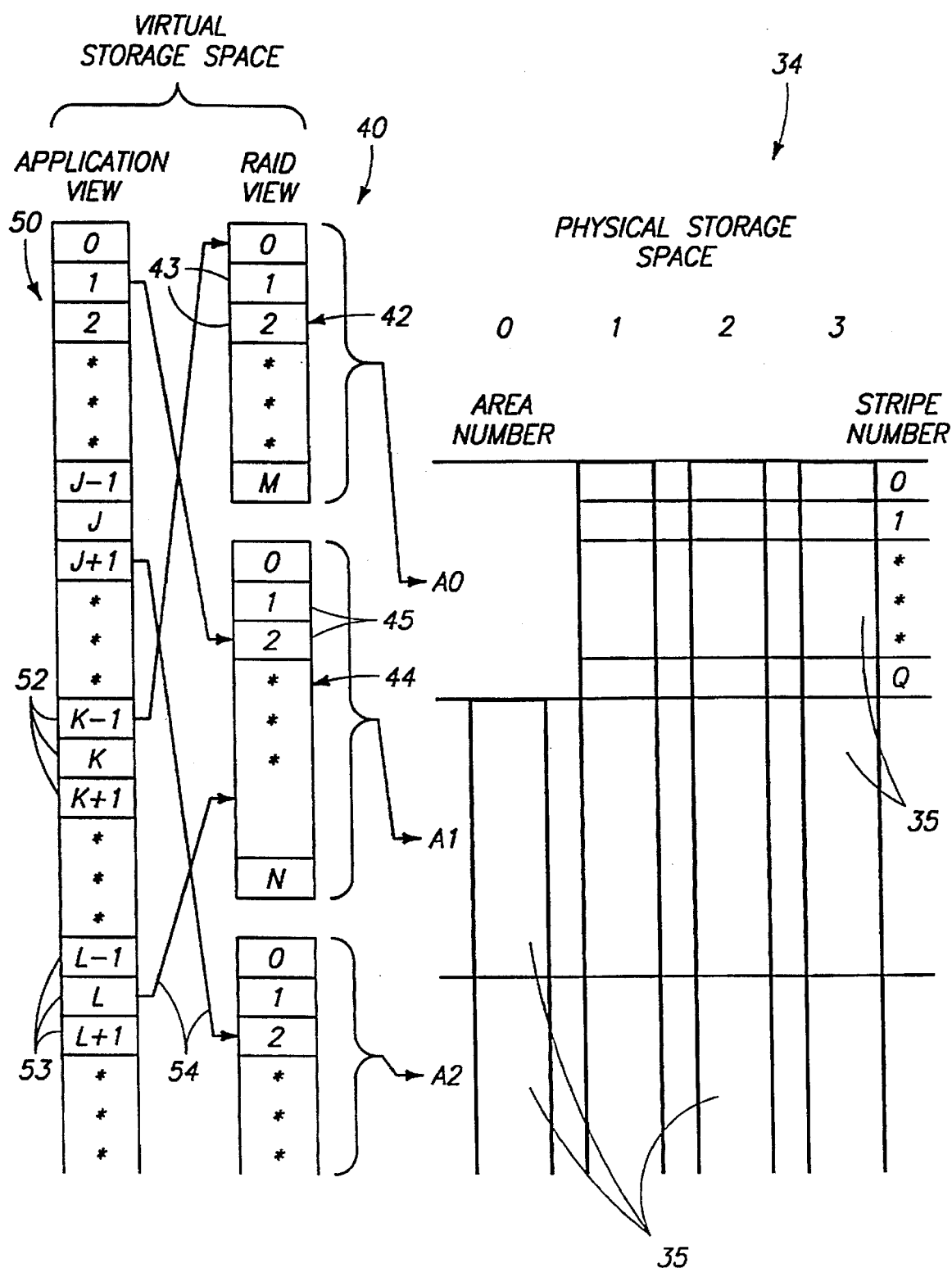
FIG. 4 is a diagrammatic illustration of a memory mapping arrangement of this invention where two virtual storage spaces are mapped onto a physical storage space.

FIG. 4 illustrates a memory mapping of the available storage space of data storage system 10 as multiple tiers of mapped virtual storage space. Each vertically elongated rectangle in the diagram represents a view of the physical storage space. In this diagram, physical storage space 34 is referenced by two virtual storage views 40 and 50. Physical storage space 34 is represented by four disks (such as disks 12 in FIG. 1) referenced by numerals 0, 1, 2, and 3. The four rectangles associated with the disks represent a view of the physical storage space wherein disks 1, 2, and 3 have approximately equal storage capacity, and disk 0 has slightly less storage capacity. Example storage capacities for such disks are 1–3 Gigabytes. The storage space 34 is partitioned into areas A0, A1, A2, etc. Individual areas contain numerous stripes, such as stripes O–Q in area A0. Individual areas also contain numerous regions 35. Regions 35 preferably consist of a selected number of uniform sized segments on every storage disk so that the regions are equal in size across the entire disk array. An example size of one region 35 is one Megabyte.

The storage space of the disks are mapped into a first, intermediate, RAID-level virtual view 40 of the physical storage space 34. This first virtual view is conceptually a set of RAID areas which can be mapped to a second application view that represents a contiguously addressable storage space. The physical configuration and RAID views of the storage space are hidden from the application view.

The RAID area storage space 40 is the view of storage that identifies the mirror and parity storage space. For instance, a RAID area 42 may represent a mirror RAID area of M allocation blocks 43 while RAID area 44 may represent a parity RAID area of N allocation blocks 45. The allocation blocks 43 and 45 are preferably equal sized, with an example size being 64 Kilobytes. These RAID areas relate to corresponding physical areas A0, A1, A2, etc., on the physical storage space 34. As an example, sixteen 64K allocation blocks 43 or 45 at the RAID virtual view can be mapped onto a single 1M region 35.

The mirror and parity RAID areas may or may not consume the entire storage space 34 of the disk array. Accordingly, during certain applications, there may be unused and undesignated storage space that does not correspond to a particular RAID area. However, such storage space can be converted into a mirror or parity RAID area. It is also noted that the RAID areas are shown as being mapped into contiguous areas on the disk array, where each region associated with a RAID area is located at the same physical address on each storage disk. The RAID areas may alternatively be mapped into noncontiguous areas on the disk array as well.

The storage space available in the RAID areas is mapped into a second, front end, application-level virtual view 50 which is a view of storage as defined by and presented to the user or host application program. When viewed by the user or host application program, the application-level virtual view 50 can represent a single large storage capacity indicative of the available storage space on storage disks 12. Virtual storage space 50 presents a view of a linear set of equal sized storage virtual blocks 52 and 53, referenced individually as 0, 1, 2, . . . J–1, J, J+1, . . . , L–1, L, L+1, . . . , etc. Virtual blocks 52 and 53 are preferably the same size as the allocation blocks in RAID area 40, with an example size being 64 Kilobytes. The virtual block storage space 50 is represented by a table of references or pointers (as represented by arrows 54) to allocation blocks in the view presented by RAID areas 40. Virtual blocks 52 and 53 at the application virtual view 50 are therefore associated with allocation blocks 43 and 45 at the RAID virtual view 40 via the pointers maintained in the virtual block table.

There are at least two types of RAID areas that can be referenced from the virtual block table: mirror and parity.

The RAID management system 16 can dynamically alter the configuration of the RAID areas over the physical storage space. The number of RAID areas for each type may be increased or decreased depending upon the amount of user data being stored in the system and the size of the physical disk storage space. As a result, the mapping of the RAID areas in the RAID-level virtual view 40 onto the disks and the mapping of the application-level virtual view 50 to RAID view 40 are generally in a state of change. The memory map store in NVRAMs 21a and 21b (FIG. 1) maintains the current mapping information used by RAID management system 16 to map the RAID areas onto the disks, as well as the information employed to map between the two virtual views. As the RAID management system dynamically alters the RAID level mappings, it also updates the mapping information in the memory map store to reflect the alterations.

The migration operation of memory system 10 will now be described with reference to FIGS. 1 and 4.

For purposes of continuing explanation, virtual blocks 53 of the application-level virtual storage space 50 reference associated allocation blocks 45 in parity RAID area 44 stored in area A1 of physical storage space 34. Such virtual blocks 53 may be referred to as "parity virtual blocks" while the associated allocation blocks 45 are referred to as "parity allocation blocks". Similarly, virtual blocks 52 reference associated allocation blocks 43 in mirror RAID area 42 stored in area A0 of physical storage space 34. Such virtual blocks 52 may be referred to herein as "mirror virtual blocks" while the associated allocation blocks 43 are referred to as "mirror allocation blocks".

In general, to migrate data from one RAID area to another, a virtual block associated with an allocation block of a first RAID level type (such as mirror or Level 1) is selected. Then, an unused allocation block representing a second RAID level type (such as parity or Level 5) is located. If an unused allocation block cannot be located, one is created. Data is next transferred from the allocation block previously associated with the selected virtual block to the unused allocation block which causes the data to undergo a redundancy level change. For example, data once stored according to mirror redundancy would now be stored according to parity redundancy, or vice versa. As a final step, the mapping 54 of the application-level virtual storage space 50 to the RAID-level virtual storage space 40 is modified and updated to reflect the shift of data. The selected virtual block that was formerly associated with an allocation block of the first RAID level type now references via an updated pointer an allocation block of the second RAID level type which contains the migrated data. Any mapping change occurring during this transaction would be updated in memory map store 21.

The continuing discussion provides a more detailed explanation of migrating data between mirror and parity storage areas according to preferred methods and sequences of this invention. To migrate data from parity to mirror storage, the following sequence is employed:

1. The RAID management system locates an unused mirror allocation block 43 in a mirror RAID area 42.

2. If none can be found, the RAID management system creates a mirror allocation block (discussed below).

3. The RAID management system suspends new storage requests to the virtual block to be migrated.

4. The RAID management system waits until all active data storage requests to the virtual block are completed.

5. The data from the parity allocation block 45 associated with virtual block 53 is read into a temporary memory buffer.

6. The data is then written to the mirror allocation block 43 chosen in step 2.

7. The virtual block table is modified to reference the new location of the data in the mirror allocation block 43.

8. The suspended storage requests are resumed.

According to the above procedure, a virtual block 53 in the application-level virtual view 50 migrated from parity to mirror storage. Relative to the intermediate virtual view 40, data has migrated from a parity allocation block 45 in parity RAID area 44 to a mirror allocation block 43 in mirror RAID area 42. In the physical storage space data has moved from area A1 to area A0.

If an unused mirror allocation block cannot be located (step 1 above), the RAID management system tries the following preferred sequence of three techniques. First, the RAID management system will try to locate an unused (and thus undesignated) RAID area, which can be converted to a mirror RAID area without violating the system threshold of unused RAID-level storage that is needed to guarantee that migration can always proceed. If this fails and the system has more than the reserved amount of unused RAID-level storage, the system migrates data within parity storage to collect unused parity allocation blocks into unused RAID areas. If this migration yields an unused RAID area that can be converted to a mirror RAID area as above, then the system converts it to a mirror RAID area. Otherwise, the system alternately migrates data from mirror to parity storage, packs mirror storage, and converts unused RAID-level storage to parity until the system increases unused RAID-level storage sufficiently for the location of an unused mirror allocation block or a conversion of an unused RAID area to a mirror RAID area. Since mirror allocation blocks occupy more physical storage space than parity allocation blocks, this last technique will result in a net increase in the amount of unused RAID-level storage.

The creation/conversion protocol used to locate and establish unused mirror allocation blocks is advantageous because it permits the RAID management system to selectively adjust the memory allocation between parity and mirror areas according to the amount of user data and the size of physical storage space. As data usage and storage capacity vary, the RAID management system employs one or more of the above three techniques to maximize the amount of data held in mirror storage.

The RAID management system attempts to avoid the situation in which a storage request must wait for the space-making sequence to yield an unused mirror allocation block by creating unused RAID areas during idle time. However, in some situations, storage requests may be suspended during the space-making sequence. The RAID management system configures the virtual block storage space in such a way that the virtual space will be smaller than the RAID view. This ensures that a free space equal to at least one RAID area is set aside for migration or other purposes. In this manner, the sequence of techniques will always yield an unused mirror allocation block.

To migrate data from mirror to parity storage, the following sequence is employed:

1. The RAID management system chooses a virtual block from 52 to migrate from mirror to parity storage according to a migration policy such as access recency or access frequency.

2. The RAID management system locates an unused parity allocation block 45 in a parity RAID area 44.

3. If such a block cannot be found, space reserved for migration is converted to a parity RAID area according to the above described creation techniques.

4. New storage requests to the virtual block to be migrated are suspended.

5. The RAID management system waits until all active storage requests to the virtual block are completed.

6. Data is read from the mirror allocation block 43 associated with virtual block 52 into a temporary memory buffer.

7. The data is written to the chosen parity allocation block 45.

8. The virtual block table is modified to reference the new location of the data in parity allocation block 45.

9. Data requests to the virtual block are resumed.

The above two enumerated sequences provide examples of how the memory system of this invention can operate to migrate data between two different levels of redundancy.

Apart from data redundancy, the disk array data storage system of this invention offers "hot spare" capabilities to enhance data availability. As discussed in the Background of the Invention section, prior art disk arrays set aside an additional physical storage disk, or "spare", that is used in the event that a storage disk fails. The extra storage disk is attached to and fully operable within the disk array, but remains idle until the storage disk failure occurs. The live storage disk is referred to as a "hot spare". The hot spare disk is used to reconstruct the data and restore redundancy in the disk array after the disk failure, a process known as "rebuilding." Unfortunately, the dedicated hot spare disks provides no usable service during normal operation when all disks are functioning properly, but instead is only useful in the event of disk failure.

According to the disk array of this invention, an amount of storage space that is sufficient to facilitate rebuilding user data in the event of disk failure is maintained in a distributed fashion over many, and preferably all, of storage disks in the array and used to increase RAID 1 storage. No one storage disk is designated as the "hot spare" disk. All disks in the array store accessible user data in such a way that storage space can be made available for rebuilding. The use of hot spare space significantly improves performance by increasing parallelism and by providing more capacity for mirror storage. In essence, the additional storage disk that had in the past been reserved solely for hot spare resources is now incorporated into the array for normal operation of storing user data.

Figure 5:
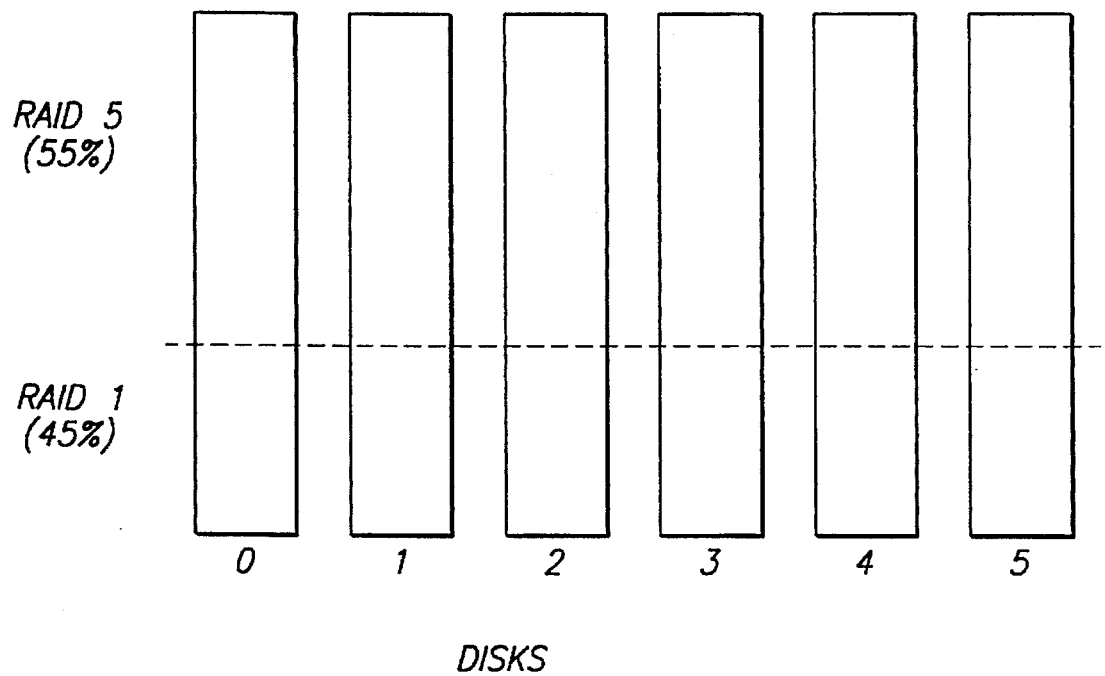
FIG. 5 is a diagrammatic illustration of storage space on multiple storage disks and shows use of hot spare resources before failure of a storage disk.

FIG. 5 shows an example six-disk homogeneous disk array having storage disks 0-5 before a disk failure occurs. All of the storage space is used to store user and redundant data according to mirror or parity techniques. No one area or one disk is reserved exclusively for hot spare resources. Here, 55% of the user data is stored in RAID 5 parity areas and 45% is stored in RAID 1 mirror areas. Even though all storage space is being used for normal data storage, a quantity of the space can be made available for reconstructing user data and restoring redundancy in the event of disk failure. In this figure, the hot spare space that can be made available is presently being used as RAID 1 storage space that is distributed across the storage disks in the array.

Figure 6:
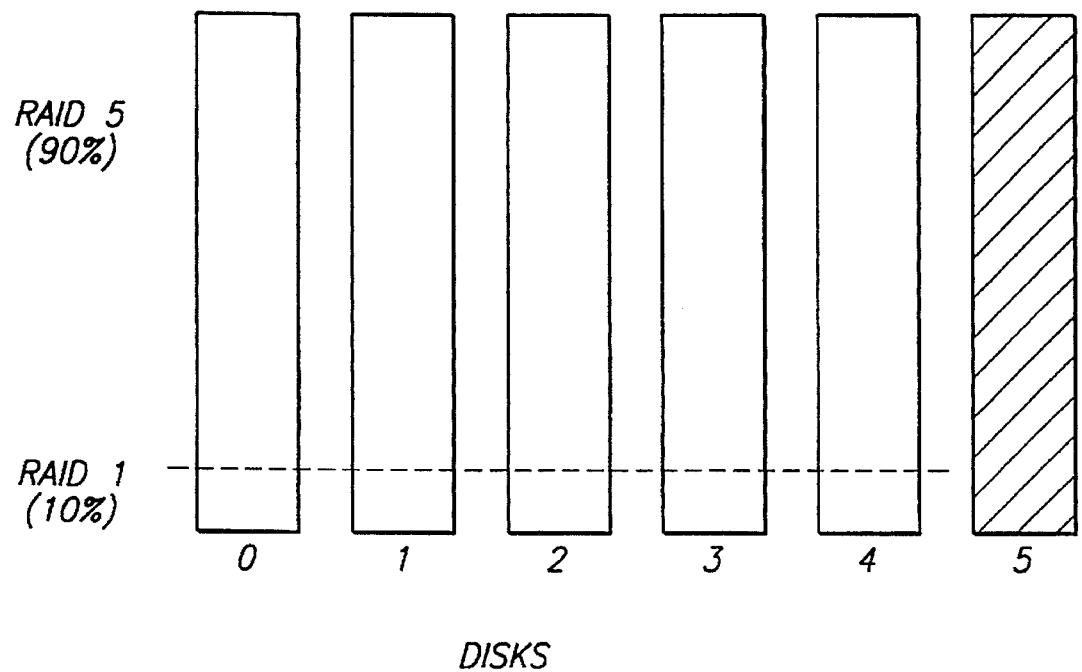
FIG. 6 is a diagrammatic illustration of storage space on multiple storage disks and shows use of hot spare resources after failure of a storage disk.

FIG. 6 shows the same disk array as FIG. 5, but following a failure of storage disk 5. The user and/or redundant data stored on disk 5 is lost. Upon failure, the disk array begins a rebuilding process to rebuild redundancy in the system. Space is made available by migrating data from mirror storage to parity storage. This migration simultaneously increases the amount of parity storage while decreasing the amount of mirror storage. Concurrently with this migration process, the size of all stripes in the system is decreased by one segment that is lost due to the failed storage disk. Notice that stripes now only extend across disks 0–4, and not across disk 5. As a result of this data migration and stripe size reduction, 90% of user data is now stored in RAID 5 areas and 10% is stored in RAID 1 areas. Redundancy has been restored to the disk array following this rebuilding process.

FIG. 7 illustrates how data migration frees up additional space following failure of disk 5. This figure shows portions of storage disks 0–5 containing two sets of three stripes, referenced generally with numerals 90 and 92. Data in the upper three stripes 90 is stored according to mirror storage techniques wherein user data is stored in segments 1–9 and redundant data is stored in segments 1'–9'. Notice that the redundant data 3', 6', and 9' on disk 5 have been lost due to the failure of this disk.

In the FIG. 7 example, assume that the user data in stripes 90 is migrated to the lower set of stripes 92. Here, due to the difference in redundant storage techniques, user data 1–9 can be stored in fewer segments. Despite loss of disk 5, the data migration made available an additional three segments (labeled as "unused") that can now be used to store user data.

The ability to use hot spare space as RAID 1 storage while guaranteeing rebuild following disk failure is managed by a memory manager. In the preferred implementation, the memory manager is embodied as the RAID management system 16 (FIG. 1) which keeps track of the user data, redundant data, and the unused space on the disk array.

The RAID management system ensures that used storage space can be made available for hot spare purposes by imposing an artificial ceiling on the amount of application-level virtual storage space (space 50 in FIG. 4) that can be committed to a user ("artificial" in that the amount of application-level virtual storage space is reduced from what would be made available if the hot spare option is turned off). To provide this ceiling, the RAID management system routinely computes a capacity of the application-level virtual storage space that can be committed to a user while user while ensuring that the disk array can still perform its required functions (such as data migration). When the user selects the hot spare option, the RAID management system computes the application level capacity as if it did not include the capacity of the largest size storage disk in the array. The capacity of the largest storage disk is used to guarantee that the rebuild process can be performed if any storage disk, including the largest, in the array fails. In a homogenous disk array where all storage disks are the same size, the capacity of any storage disk can be used.

Once the artificial ceiling is computed, the RAID management system enforces this limit by preventing commitment of additional application-level virtual storage space beyond the computed capacity. This combined capacity analysis and enforcement artificially reduces the size of the application-level virtual storage space to thereby ensure that a sufficient quantity of the RAID-level virtual storage space can be made available for rebuilding in the event any storage disk fails.

If the current amount of application-level virtual storage space cannot be filled while simultaneously guaranteeing hot spare, the RAID management system generates a warning to inform the user that hot spare space is not available. This situation might arise when the disk array has already lost one storage disk. For example, the disk array of FIG. 6 which already has failed disk 5 could not undergo another disk loss and still maintain redundancy of the user data. Another situation might arise when the user did not initially enable the hot spare option, but later requests this feature after the size of the application-level virtual storage space has already been set. The disk array might at that point be unable to guarantee hot spare resources.

FIG. 8 shows a preferred method of operating the disk array during normal conditions and in the case of disk failure. At step 100, the RAID management system 16 maps the physical storage space provided by disk array 12 into a first or RAID-level virtual storage space 40 (see FIG. 4). As described above, the RAID-level virtual storage space presents the physical storage space as mirror and parity RAID areas. At step 102, the RAID management system ensures that enough storage space across the disk array can be made available for use in the event of disk failure.

Initially, when data is first being placed in the system, the data is stored entirely in mirror storage (step 104). The user data and its redundant counterpart are preferably spread evenly throughout the disks in the array. Mirror storage affords better performance and reliability in comparison to parity storage, and thus is the preferred storage type. When the amount of user data reaches approximately one-half physical capacity of the disks in the system, the disk array is effectively full because the user data consumes roughly one-half of the storage capacity and the redundant data consumes the other one-half. As the amount of user data exceeds the 50% threshold, the RAID management system begins storing data in both mirror and parity RAID areas using data migration between the types (step 106). More user data can be stored in the same amount of space using parity storage as opposed to mirror storage (as illustrated above in FIG. 7). As the data storage system continues to fill, proportionally more data is migrated to parity storage to accommodate the increasing volume of data. The amount of user data in mirror storage decreases.

In the event that a storage disk fails at any time during normal operation (as illustrated by the dashed lines to step 108), the RAID management system initiates the rebuilding process. At step 109, the RAID management system evaluates whether there is an adequate amount of hot spare space that can be made available in the event of disk failure. In other words, can the system without the failed storage disk be able to store all of the committed capacity with redundancy? If there is not an adequate amount of space to store all of the committed capacity with redundancy in the event of a disk failure (i.e., the "no" branch from step 109), the disk array storage system is operated in a degraded condition without hot spare resources or the ability to restore redundancy (step 111).

On the other hand, if there is adequate space for hot spare (i.e., the "yes" branch from step 109), the RAID management system determines whether enough space has been made available for purposes of reconstructing user data and restoring redundancy (step 110). If there has been (i.e., the "yes" branch from step 110), the disk array uses the available free space for reconstructing the user data from the failed storage disk and restoring redundancy (step 112). Alternatively, if there has not been enough space made available (i.e., the "no" branch from step 110), the RAID management system migrates user data from mirror storage to parity storage to free up available storage space to compensate for the lost space on the failed storage disk. The RAID management system continues to migrate data from mirror to parity storage (as represented by the loop of steps 110 and 114) until a sufficient amount of available storage space is freed up to eliminate the need for the failed disk space.

The disk array system of this invention is advantageous over prior art disk arrays in that all storage disks are equally used to store data in mirror storage while guaranteeing rebuild following a disk failure. There is no dedicated storage disk that goes unused until failure occurs. The use of hot spare storage as mirror storage significantly improves performance of the overall disk array by increasing parallelism and decreasing the complexity of managing the writes into redundant storage spaces.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for providing storage space in a hierarchic storage disk array for use in rebuilding in the event a storage disk fails, the disk array having a plurality of storage disks that define a physical storage space the physical storage space being mapped into a RAID-level virtual storage space that presents the physical storage space as multiple RAID areas including mirror and parity RAID areas, the method comprising the following steps:

prior to a disk failure, storing user data in both the mirror and parity RAID areas in a manner that the user data is distributed across all of the storage disks;

storing redundant data on at least one of the storage disks;

ensuring that a sufficient quantity of storage space can be made available for reconstructing the user data and restoring redundancy in the event one of the storage disks fails so that the user data is stored in both the mirror and parity RAID areas on all storage disks before and after the storage disk failure; and using the quantity of storage space to store both user and redundant data until the storage disk failure occurs.

2. A method according to claim 1 further comprising the additional step of distributing any available storage space that can be used for reconstructing user data and restoring redundancy across all of the storage disks in the disk array.

3. A method according to claim 1 further comprising the step of converting the storage space used to store user and redundant data to hot spare space for reconstructing the user data and restoring redundancy.

4. A method according to claim 1 further comprising the step of generating a warning to inform a user that hot spare resources cannot be guaranteed when it is determined that a sufficient quantity of storage space cannot be made available for reconstructing user data and restoring redundancy in the disk array following a disk failure.

5. A method for providing storage space for use in rebuilding in a hierarchic data storage system, the data storage system comprising a disk array of more than two storage disks of selected capacities that define a physical storage space, the method comprising the following steps:

mapping the physical storage space into a RAID-level virtual storage space which presents the physical storage space as multiple RAID areas, the RAID areas including mirror RAID areas which store data according to mirror redundancy and parity RAID areas which store data according to parity redundancy, the mirror and parity RAID areas extending across all of the storage disks in the disk array;

storing user data in both the mirror and parity RAID areas in a manner that the user data is distributed across all of the storage disks in the disk array;

ensuring that a sufficient quantity of the RAID-level virtual storage space can be made available for reconstructing user data and restoring redundancy in the event of a storage disk failure;

using the quantity of the RAID-level virtual storage space to store data until the storage disk failure occurs; and in the event of a storage disk failure, performing one of the following two steps: (a) using unused storage space which is not allocated as mirror or parity RAID areas as the storage space to reconstruct user data and restore redundancy from the failed storage disk, or (b) migrating user data from mirror RAID areas to parity RAID areas and packing the mirror RAID areas to free up storage space to compensate for the space lost from the failed storage disk;

wherein each storage disk stores data according to both mirror and parity redundancy before and after storage disk failure.

6. A method according to claim 5 further comprising the additional step of using the quantity of storage space for reconstructing the user data and restoring redundancy.

7. A method according to claim 5 further comprising the following steps:

mapping the RAID-level virtual storage space into an application-level virtual storage space;

dynamically migrating the user data between the mirror and parity RAID areas; and computing a capacity of the application-level virtual storage space that can be committed to a user without including a capacity of the largest size storage disk.

8. A method according to claim 7 further comprising the additional step of preventing commitment of additional application-level virtual storage space beyond the computed capacity to ensure that the sufficient quantity of the RAID-level virtual storage space can be made available for rebuilding.

9. A method according to claim 5 further comprising the following step:

in the event that the sufficient quantity of the RAID-level virtual storage space cannot be ensured, generating a warning to inform a user that hot spare resources cannot be guaranteed.

10. A method according to claim 5 wherein any available storage space that can be used for reconstructing user data and restoring redundancy is distributed across multiple ones of the storage disks in the disk array.

11. A data storage system comprising:

a hierarchic disk array having a plurality of storage disks that define a physical storage space;

a disk array controller coupled to the disk array for coordinating transfer of user data to and from the storage disks;

a memory manager operatively coupled to the disk array controller to manage a map of the physical storage space into a RAID-level virtual storage space which presents the physical storage space as multiple RAID areas including mirror RAID areas which store data according to mirror redundancy and parity RAID areas which store data according to parity redundancy, the memory manager storing user data in both the mirror and parity RAID areas in a manner that the user data is distributed across all of the storage disks in the disk array prior to any disk failure; and the memory manager maintaining a sufficient quantity of storage space that can be made available for reconstructing the user data and restoring redundancy in the event one of the storage disks fails, the memory manager using the quantity of storage space to store both user and redundant data while guaranteeing that the storage space can be made available for rebuilding following a storage disk failure so that each storage disk stores the user data according to both mirror and parity redundancy before and after storage disk failure.

12. A data storage system according to claim 11 wherein the memory manager distributes any available storage space that can be used for reconstructing the user data and restoring redundancy among the storage disks in the disk array.

13. A data storage system according to claim 11 wherein:

the RAID management system stores user data in mirror RAID areas and in the event of a storage disk failure, migrates user data from mirror RAID areas to parity RAID areas to free up storage space to compensate for the space lost from the failed storage disk.

14. A data storage system according to claim 11 wherein:

the RAID management system further mapping the RAID-level virtual storage space into an application-level virtual storage space; and the RAID management system computing a capacity of the application-level virtual storage space that can be committed to a user without including a capacity of a largest size storage disk.

15. A data storage system according to claim 14 wherein the RAID management system prevents commitment of additional application-level virtual storage space beyond the computed capacity to ensure that the sufficient quantity of the RAID-level virtual storage space can be made available for reconstructing the user data and restoring redundancy.

16. A data storage system according to claim 11 wherein, in the event that the sufficient quantity of the RAID-level virtual storage space cannot be maintained, the RAID management system generates a warning to inform a user that hot spare resources cannot be guaranteed.

17. A method for operating a hierarchic data storage system, the data storage system comprising a disk array of plural storage disks of selected capacities that define a physical storage space, the physical storage space being mapped into a RAID-level virtual storage space which presents the physical storage space as multiple RAID areas, the RAID areas including mirror RAID areas which store data according to mirror redundancy and parity RAID areas which store data according to parity redundancy, the RAID areas extending across the storage disks in the disk arrays, the method comprising the following steps:

storing user data in the mirror and parity RAID areas in a manner that the user data is distributed across all of the storage disks in the disk array and all of the storage disks store the user data according to both mirror and parity RAID redundancy;

ensuring that a sufficient quantity of the RAID-level virtual storage space can be made available for reconstructing user data and restoring redundancy in the event of a storage disk failure;

dynamically migrating the user data between the mirror and parity RAID areas;

in the event of a storage disk failure, continuously migrating the user data from mirror RAID areas to parity RAID areas and rebuilding redundancy; and wherein each storage disk stores the user data according to both mirror and parity redundancy before and after storage disk failure.

18. A method according to claim 17 wherein each storage disk stores data according to both RAID 1 and RAID 5 before and after the storage disk failure.

19. A method according to claim 17 further comprising the step of dynamically migrating data between the mirror and parity RAID areas after redundancy is restored following the storage disk failure.

20. A method according to claim 17 further comprising the following steps:

initially storing the user data in mirror RAID areas; and storing the user data in both mirror and parity RAID areas as the amount of user data exceeds a threshold amount.

* * * * *